United States Patent
Numata et al.

(10) Patent No.: US 6,341,084 B2
(45) Date of Patent: Jan. 22, 2002

(54) MAGNETIC RANDOM ACCESS MEMORY CIRCUIT

(75) Inventors: Hideaki Numata; Kouichi Takeda, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/854,481

(22) Filed: May 15, 2001

(30) Foreign Application Priority Data

May 15, 2000 (JP) ........................................ 2000-142361

(51) Int. Cl.⁷ .............................................. G11C 11/00
(52) U.S. Cl. ......................... 365/158; 365/171; 365/173
(58) Field of Search ................................. 365/158, 171, 365/173

(56) References Cited

U.S. PATENT DOCUMENTS

| | | | |
|---|---|---|---|
| 5,640,343 A | | 6/1997 | Gallagher et al. .......... 365/171 |
| 5,699,293 A | * | 12/1997 | Tehrani et al. .............. 365/171 |
| 5,748,519 A | | 5/1998 | Tehrani et al. .............. 365/171 |
| 5,793,697 A | * | 8/1998 | Scheuerlein ................. 365/171 |
| 6,191,972 B1 | | 2/2001 | Miura et al. ................. 365/171 |
| 6,259,644 B1 | * | 7/2001 | Tran et al. ................... 365/171 |

OTHER PUBLICATIONS

J.L. Brown et al., "1–Mb Memory Chip Using Giant Magnetoresistive Memory Cells", IEEE Transactions on Components, Packaging and Manufacturing Technology, Part A, vol. 17, No. 3, Sep. 1994, pp. 373–379 with Abstract.

J.J. Sun et al., "Bias Voltage dependence of Tunneling Magnetoresistance and Annealing Effect in Spin Dependent Tunnel Junctions", J. Magn. Soc., Japan, vol. 23, No. 1–2, (1999), pp. 55–57.

W. Oepts et al., "Observation and analysis of breakdown of magnetic tunnel junctions", Journal of Magnetism and Magnetic Materials, vol. 198–199, No. 1–2, (1999), pp. 164–166 with Abstract.

* cited by examiner

Primary Examiner—Trong Phan
(74) Attorney, Agent, or Firm—Sughrue Mion, PLLC

(57) ABSTRACT

In a magnetic random access memory circuit, the potential of all sense lines 121 to 124 are equalized, and the potential of all not-selected word lines 133, 135, 136 are equalized and the selected word line 134 is grounded so that a previously charged capacitor 114 is discharged by a current path passing from the capacitor 114 through a MOS transistor 118 maintaining the potential of the sense line 122 at a constant voltage lower than a break voltage, through the selected sense line 122, through the selected magneto-resistive element 142 and through the selected word line 134. Thus, a voltage applied to the magneto-resistive element is maintained at a level smaller than a voltage breaking the magneto-resistive elements or a voltage remarkably deteriorating the characteristics of the magneto-resistive elements because of a biasing effect when the tunnel magneto-resistive element is used, and on the other hand, a high precise and high speed reading can be realized.

11 Claims, 8 Drawing Sheets

MAGNETIC RANDOM ACCESS MEMORY CIRCUIT

BACKGROUND OF THE INVENTION

The present invention relates to a random access memory circuit, and more specifically to a magnetic random access memory circuit (called a "MRAM circuit" in this specification).

A magnetic random access memory includes a plurality of memory cells located at intersections of word lines and bit lines, each memory cell being basically constituted of a pair of ferromagnetic layers separated by an insulating or non-magnetic metal layer. Digital information is represented by the direction of magnetic vectors in the ferromagnetic layers, and is infinitely maintained unless it is intentionally rewritten. In order to write or change the state of the memory cell, a composite magnetic field which is generated by use of a word current and a bit current and which is larger than a threshold, is applied to the memory cell, so as to reverse the magnetization of the ferromagnetic layers.

U.S. Pat. No. 5,748,519 and IEEE Transaction On Components Packaging and Manufacturing Technology—Part A, Vol. 170, No. 3, pp373–379 (the content of which are incorporated by reference in its entirety into this application) disclose a first example of the magnetic random access memory which includes a number of memory cells configured to utilize a giant magneto-resistive (GMR) effect. Referring to FIG. 1, there is shown a layout diagram of a simplified MRAM circuit including each memory cell configured to utilize the GMR effect. The MRAM circuit is conventionally formed on a semiconductor substrate on which other circuits are formed, so that the MRAM circuit and other circuits are formed on the same substrate in a mixed condition. As shown in FIG. 1, the MRAM circuit includes a memory array divided into a first array portion 604 and a second array portion 605, a decoder consisting of a row decoder 602 and a column decoder 603, and a comparator 606. The row decoder 602 and the column decoder 603 are connected to an address bus 601, respectively. In a reading operation, one of the first array portion 604 and the second array portion 605 is used as a reference cell. In each array portion, a plurality of GMR elements are connected in series in each one row. In the reading operation, a current is caused to flow in a selected row of each of the first array portion 604 and the second array portion 605, a difference between respective voltages generated in the first array portion 604 and the second array portion 605 is detected by the comparator.

U.S. Pat. No. 5,640,343 (the content of which is incorporated by reference in its entirety into this application) discloses a second example of the magnetic random access memory includes a number of memory cells configured to utilize a magnetic tunnel junction (MTJ) effect. Referring to FIG. 2, there is shown a MRAM circuit including each memory cell configured to utilize the MTJ effect. The shown MRAM circuit includes row decoders 701 and 702, column decoders 703 and 704, and a matrix circuit having a number of MTJ elements 711 to 715 and so on located at intersections of word lines 705, 706 and 707 extending between the row decoders 701 and 702 and bit lines 708, 709 and 710 extending between the column decoders 703 and 704. In this MRAM circuit, a stored information is distinguished dependent upon whether a sense current is large or small. However, this patent does not disclose a method for detecting the magnitude (large or small) of the sense current, nor does it show how to connect a comparator (sense amplifier).

In this first prior art example, a resistance of serially connected memory cells is directly detected. However, the resistance detected includes an on-resistance of a transistor connected in series with the row. In addition, a memory cell array and a reference cell array are separated or put apart from each other. Therefore, a reference signal is inclined to contain a parasite component, with the result that it is difficult to have a sufficient margin in operation. Accordingly, a high level of equality in characteristics is required for memory cells on the same wafer. In addition, since it is so configured to detect the voltage of a plurality of serially connected memory cells, a magnetically changed component of the resistance is small in comparison with the resistance of the whole of the row, with the result that a device variation and a noise resisting property are deteriorated. Furthermore, in order to make the detecting sensitivity large, it is necessary to enlarge a detecting current or to bring the GMR element into an elongated form so as to increase the device resistance This results in an increased power consumption and in an increased circuit area.

In the second prior art example, each memory cell includes a diode. Similarly, each memory cell can be easily constructed to include a transistor. In the memory cell including the diode or the transistor, however, the cell construction becomes complicated, and therefore, is difficult to integrate the circuit. On the other hand, it is not so easy to construct a two-dimensional array with only the magneto-resistive elements which cannot operate as a complete on-off switch, because a detouring of the current in the cells must be considered.

Furthermore, in conventional GMR elements, since the current is caused to flow in parallel to a film surface, a fundamental resistance is equivalent to a wiring resistance. Accordingly, if a wiring conductor, a transistor and a magneto-resistive element are connected in series and the voltage of the whole of the series-connected circuit is directly measured, a voltage drop occurring across the wiring conductor and the transistor is not negligible, and a highly precise reading circuit (sense amplifier) becomes necessary.

Journal of Magnetics Society of Japan, Vol. 23, No. 1–2, pp55–57 mentions that a tunnel magneto-resistive element (TMR element) has such a feature that when a voltage applied between opposite ends of the junction increases, the magneto-resistive ratio (MR ratio) decreases. This is generally called a bias effect and is well known to persons skilled in the art. Because of this bias effect, even if a large voltage is applied across the TMR element, the changed component of the device voltage caused by a magnetic field does not necessarily proportionally become large. Therefore, a highly precise reading circuit becomes necessary.

Journal of Magnetism and Magnetic Materials, Vol. 198–199, No. 1–2, pp164–166 mentions that a large voltage is applied between opposite ends of the TMR element having a thin tunnel barrier, there is a problem in which a tunnel barrier is broken by an electric field and heat, so that a device lift is shortened.

BRIEF SUMMARY OF THE INVENTION

Accordingly, it is an object of the present invention to provide an MRAM circuit having a large operation margin, by eliminating influence of variation in characteristics of magneto-resistive elements depending upon a geographical location on the same wafer, to the utmost.

Another object of the present invention is to provide a highly sensitive MRAM circuit capable of reading at a high speed, by preventing a lowering of the detecting sensitivity of a reading circuit, attributable to a voltage drop caused by the resistance of the wiring conductor and the transistor connected in series with the magneto-resistive element.

Still another object of the present invention is to provide an MRAM circuit having a tunnel type magneto-resistive element, which is a highly sensitive and can be read at a high speed, by preventing the bias effect of the magneto-resistance and the breakage of the tunnel barrier.

A further object of the present invention is to provide an MRAM circuit which can be integrated with a high integration density, by eliminating the diode or the transistor in the basic memory cell.

The above and other objects of the present invention are achieved in accordance with the present invention by a magnetic random access memory circuit comprising:

a memory cell array having a plurality of sense lines, a plurality of word lines intersecting the plurality of sense lines, a number of magneto-resistive elements located at intersections between the plurality of sense lines and the plurality of word lines, each of the magneto-resistive elements being connected between one sense line and one word line;

a plurality of capacitors of the number corresponding to the number of the plurality of sense lines, the plurality of capacitors being previously charged to a high voltage before a reading operation is carried out, each of the plurality of capacitors being connected to a corresponding sense line of the plurality of sense lines through a voltage drop means so that a voltage lower than the high voltage charged in the capacitors is applied to the plurality of sense lines; and means for equalizing the potential of all the plurality of sense lines and all not-selected word lines of the plurality of word lines and for grounding a selected word line of the plurality of word lines so that an electric charge previously stored in the capacitor connected through the voltage drop means to a selected sense line is discharged through the voltage drop means, the selected sense line, a selected magneto-resistive element, and the selected word line, whereby information stored in the selected magneto-resistive element is read out by a potential on the capacitor.

According to another aspect of the present invention, there is provided a magnetic random access memory circuit comprising:

a memory cell array having a plurality of sense lines, a plurality of word lines intersecting the plurality of sense lines, a number of magneto-resistive elements located at intersections between the plurality of sense lines and the plurality of word lines, each of the magneto-resistive elements being connected between one sense line and one word line;

an X peripheral circuit connected to the plurality of word lines and including an X decoder receiving an X address portion of a given address;

a Y peripheral circuit connected to the plurality of sense lines and including a Y decoder receiving an Y address portion of the given address;

wherein the Y peripheral circuit includes a plurality of pairs of series-connected first and second MOS transistors connected to the plurality of sense lines, respectively, each first MOS transistor having one end connected to a corresponding sense line of the plurality of sense lines, the other end connected to one end of the corresponding second MOS transistor, a gate connected to a reference voltage circuit, each second MOS transistor having the other end connected to a voltage supply and a gate connected to receive a corresponding output of the Y decoder, a connection node between the first MOS transistor and the second MOS transistor being connected to one end of a capacitor having the other end connected to ground, wherein the X peripheral circuit includes a plurality of pairs of series-connected third and fourth MOS transistors having their gate connected to receive a corresponding output of the X decoder so as to operate complementarily to each other, the third MOS transistor having one end connected to a voltage supply and the other end connected to one end of the fourth MOS transistor, the other end of the fourth MOS transistor being connected to ground, a connection node of the third and fourth MOS transistors being connected to a corresponding word line of the plurality of word lines.

In one embodiment of the magnetic random access memory circuit, the Y peripheral circuit includes a plurality of differential amplifiers, each of the differential amplifiers having a pair of inputs connected to a pair of the capacitors connected through a pair of the first MOS transistors to a pair of adjacent sense lines, so that one of a pair of magneto-resistive elements connected to the same word line and to the pair of adjacent sense lines constitutes a memory cell, and the other of the pair of magneto-resistive elements constitutes a reference cell which stores data complementary to data stored in the memory cell, whereby a difference between voltages of the pair of capacitors connected to the pair of adjacent sense lines through the pair of first MOS transistors, respectively, generated dependently upon respective resistance value conditions of the memory cell and the reference cell, is detected by the differential amplifier.

Another embodiment of the magnetic random access memory circuit can further includes:

a second X peripheral circuit provided in symmetry to the first mentioned X peripheral circuit with respect to the Y peripheral circuit, the second Y peripheral circuit having the same construction as that of the first mentioned X peripheral circuit; and a second memory cell array provided in symmetry to the first mentioned memory cell array with respect to the Y peripheral circuit, the second memory cell array having the same construction as that of the first mentioned memory cell array;

the Y peripheral circuit being in common to the first mentioned memory cell array and the second memory cell array, each of the first mentioned memory cell array and the second memory cell array including a plurality of reference resistors connected between at least one word line and the plurality of sense lines, respectively, wherein when a magneto-resistive element included in one of the first mentioned memory cell array and the second memory cell array, is selected to be read out, the voltage of the capacitor connected to the selected magneto-resistive element through the first MOS transistor is compared with the voltage of the capacitor connected to one reference resistor through the first MOS transistor in the other of the first mentioned memory cell array and the second memory cell array.

Still another embodiment of the magnetic random access memory circuit can further includes a plurality of comparators each having one input connected to the reference voltage circuit, the other input connected to the corresponding sense line, and an output connected to the gate of the corresponding first MOS transistor so that the potential on the corresponding sense line is precisely feedback-controlled on the basis of a reference voltage of the reference voltage circuit.

According to still another aspect of the present invention, there is provided a magnetic random access memory circuit comprising:

a memory cell array having a plurality of sense lines, a plurality of word lines intersecting the plurality of sense lines, a number of magneto-resistive elements located at intersections between the plurality of sense lines and the plurality of word lines, each of the magneto-resistive elements being connected between one sense line and one word line;

an X peripheral circuit connected to the plurality of word lines and including an X decoder receiving an X address portion of a given address;

a Y peripheral circuit connected to the plurality of sense lines and including a Y decoder receiving an Y address portion of the given address;

wherein the Y peripheral circuit includes:

a plurality of pairs of parallel-connected first and second MOS transistors having their gate connected to receive corresponding outputs of the Y decoder, respectively, each of the pairs of first and second MOS transistors being provided for a corresponding one of the plurality of sense lines, one end of each of the first and second MOS transistors being connected to a voltage supply, the other end of the first and second MOS transistors being connected to ground through a first capacitor and a second capacitor, respectively;

a plurality of pairs of series-connected third and fourth MOS transistors having their gates connected to receive a corresponding output of the Y decoder so as to operate complementarily to each other, each pair of the pairs of series-connected third and fourth MOS transistors being connected between the other end of the corresponding first MOS transistor and the other end of the corresponding second MOS transistor; and a plurality of fifth MOS transistors having their gates connected to a reference voltage circuit, each of the plurality of fifth MOS transistors having one end connected to a connection node between the corresponding seventh and eighth MOS transistors, and the other end connected to a corresponding sense line of the plurality of sense lines, whereby a voltage on the connection node between the first capacitor and the corresponding first MOS transistor and a voltage on the connection node between the second capacitor and the corresponding second MOS transistor are compared for reading out data on a selected magneto-resistive element connected to the corresponding sense line, wherein the X peripheral circuit includes a plurality of pairs of series-connected sixth and seventh MOS transistors having their gate connected to receive a corresponding output of the X decoder so as to operate complementarily to each other, the sixth MOS transistor having one end connected to a voltage supply and the other end connected to one end of the eleventh MOS transistor, the other end of the eleventh MOS transistor being connected to ground, a connection node of the tenth and eleventh MOS transistors being connected to a corresponding word line of the plurality of word lines, wherein the magnetic random access memory circuit further includes a timing controller for controlling respective operation timings of the X decoder and the Y decoder.

An embodiment of the magnetic random access memory circuit can further includes a plurality of comparators each having one input connected to the reference voltage circuit, the other input connected to the corresponding sense line, and an output connected to the gate of the corresponding fifth MOS transistor so that the potential on the corresponding sense line is precisely feedback-controlled on the basis of a reference voltage of the reference voltage circuit.

In the above mentioned magnetic random access memory circuits in accordance with the present invention, each of the magneto-resistive elements can be constituted of a tunnel magneto-resistive element or a giant magneto-resistive element.

The above and other objects, features and advantages of the present invention will be apparent from the following description of preferred embodiments of the invention with reference to the accompanying drawings.

DETAILED DESCRIPTION OF THE INVENTION

Now, embodiments of the MRAM circuit in accordance with the present invention will be described with reference to the drawings.

Figure 1:
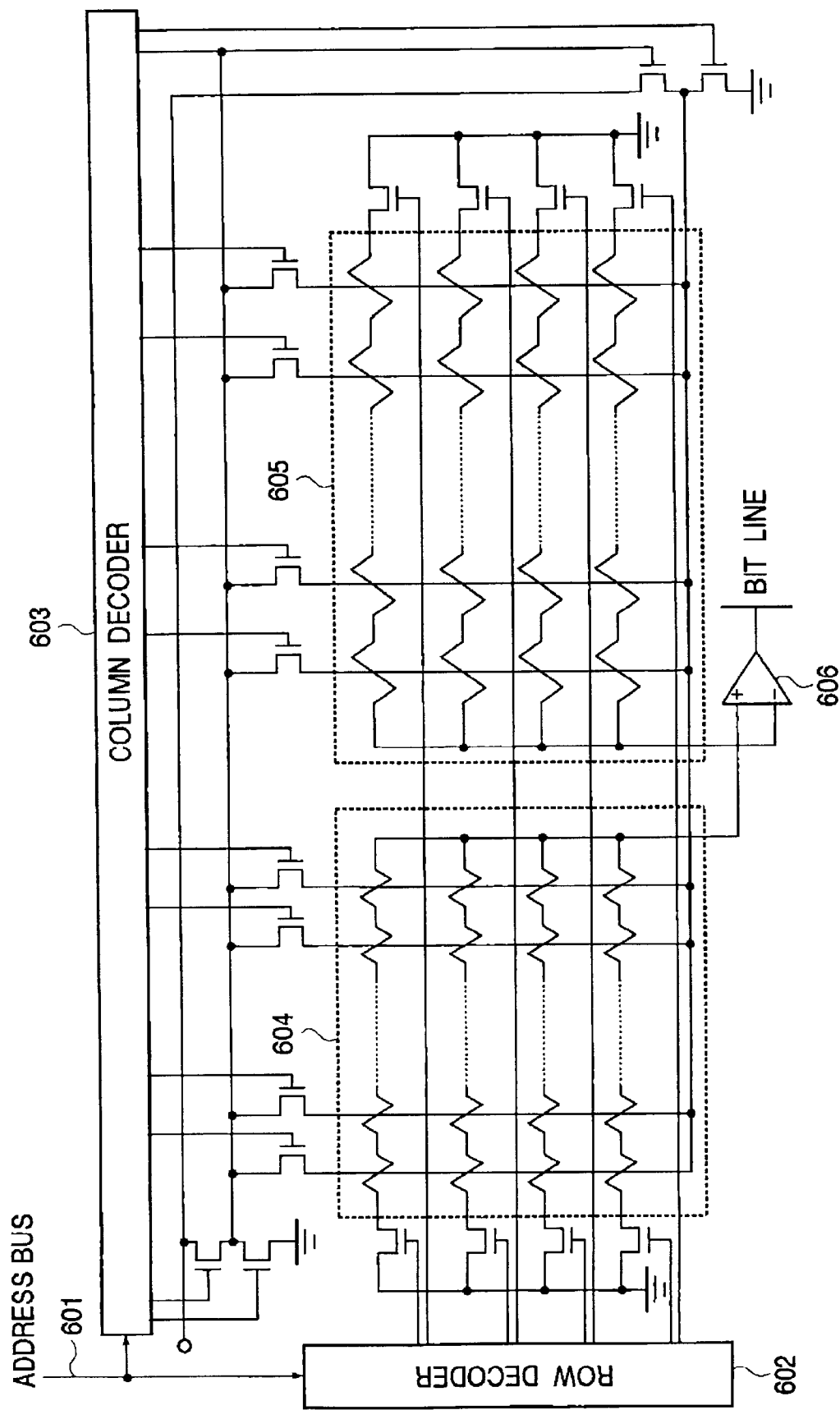
FIG. 1 is a circuit diagram of a layout diagram of a simplified MRAM circuit which includes a number of memory cells configured to utilize the GMR effect.
Figure 2:
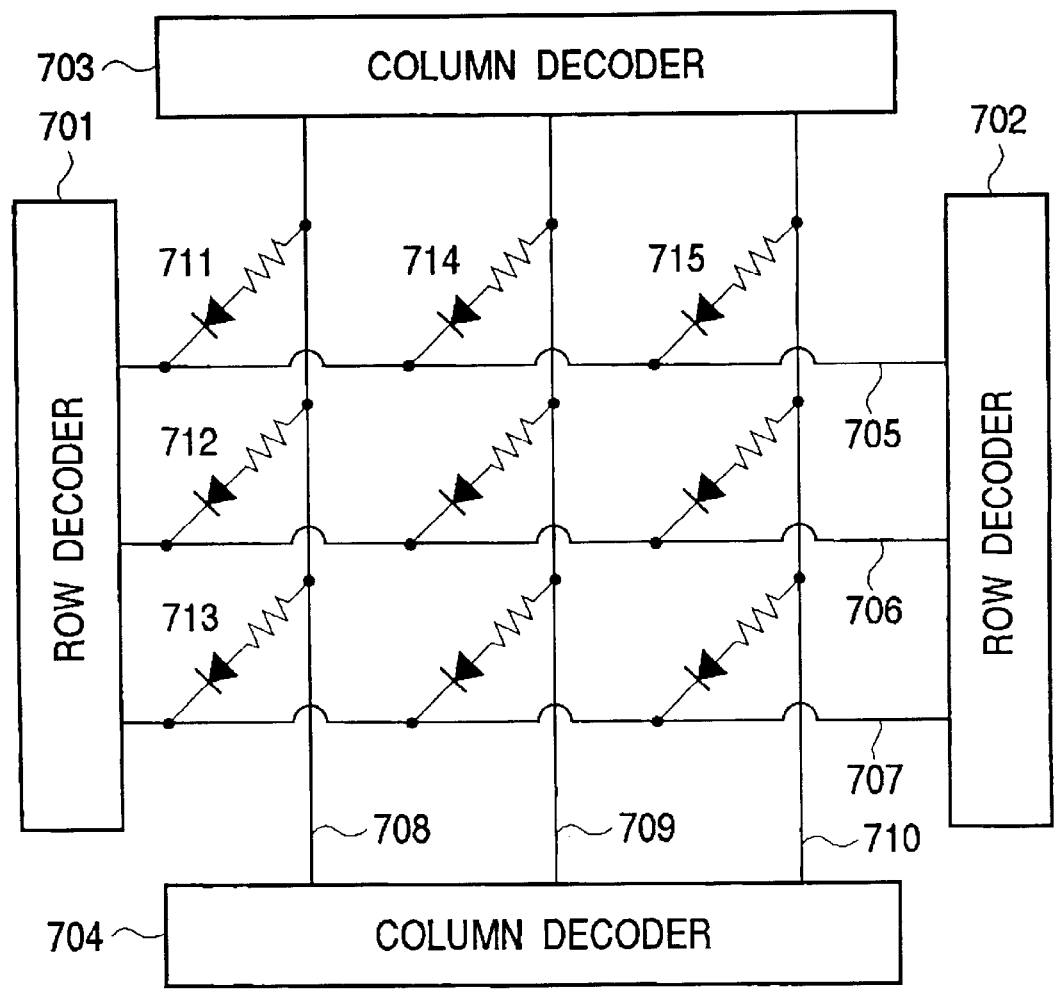
FIG. 2 is a circuit diagram of a MRAM circuit which includes a number of memory cells configured to utilize the MTJ effect.
Figure 3:
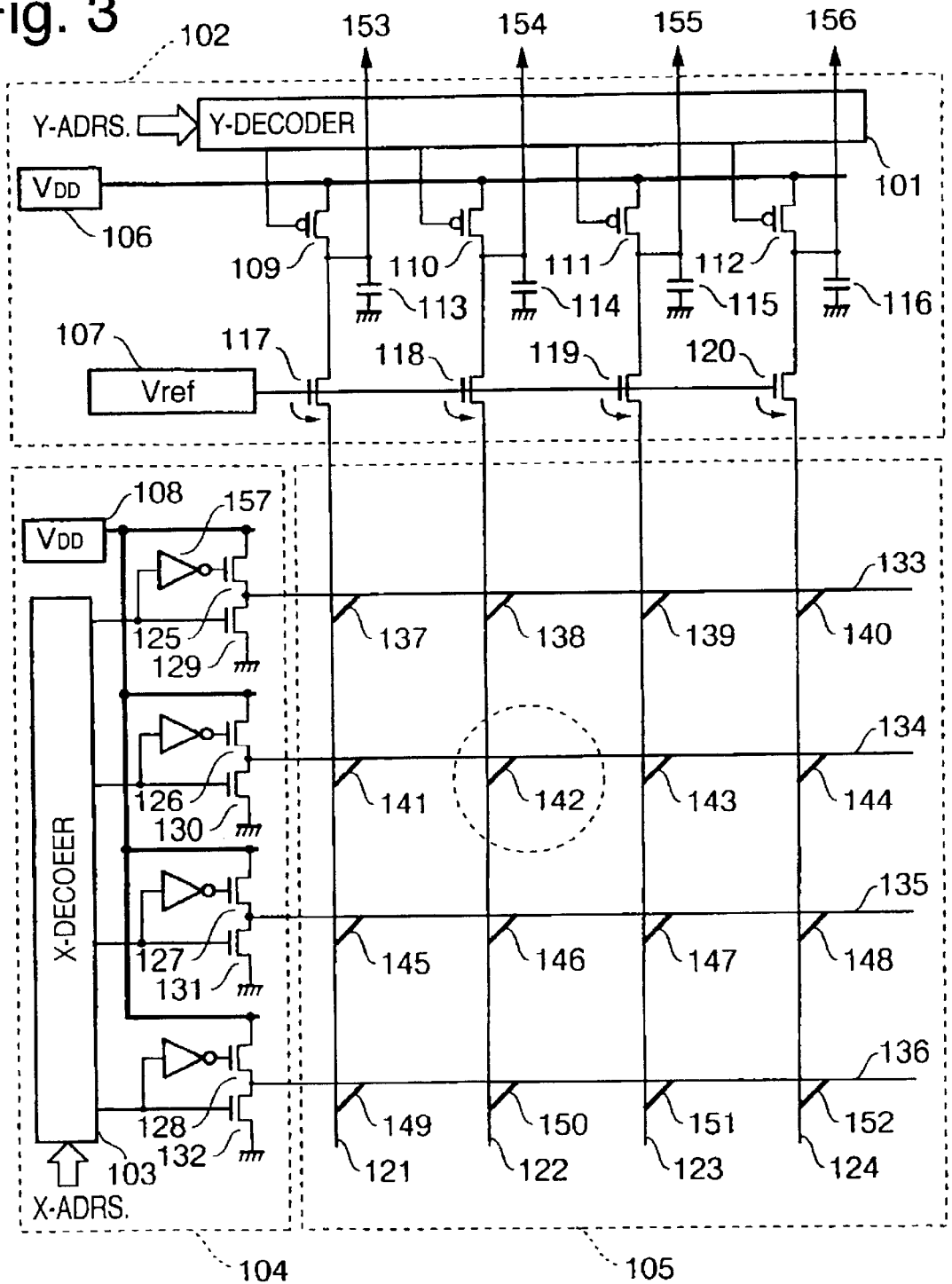
FIG. 3 is a circuit diagram of a first embodiment of the MRAM circuit in accordance with the present invention.

Referring to FIG. 3, there is shown a circuit diagram of a first embodiment of the MRAM circuit in accordance with the present invention. For simplification of the drawing, a 4×4 bit MRAM circuit is shown as an example, but it would be apparent to persons skilled in the art that an "m"×"n" bit MRAM circuit can be constructed if necessary, where "m" and "n" are natural numbers not less than 2.

The shown MRAM circuit in accordance with the present invention includes a Y-peripheral circuit 102 having a Y decoder 101 receiving a Y address portion of an address, an X-peripheral circuit 104 having an X decoder 103 receiving an X address portion of the address, and a cell array 105.

The Y-peripheral circuit 102 comprises the Y decoder 101, MOS transistors 109 to 112 having their gate connected to the Y decoder 101, a voltage supply 106 connected to one end (source) of the MOS transistors 109 to 112, MOS transistors 117 to 120 having their gate connected to an output of a reference voltage circuit 107 and capacitors 113 to 116 having their one end connected to ground. The other end (drain) of the MOS transistors 109 to 112 are connected to an input side end (drain) of the MOS transistors 117 to 120 and the other end of the capacitors 113 to 116, respectively. These connection nodes are connected through output lines 153 to 156 to a succeeding stage of output circuit (not shown), respectively, in order to detect a potential on the capacitors 113 to 116. An output side end (source) of the MOS transistors 117 to 120 are connected to sense lines 121 to 124 in the cell array 105, respectively.

The X-peripheral circuit 104 comprises the X decoder 103, source-grounded MOS transistors 129 to 132 having their gate connected to the X decoder 103, MOS transistors 125 to 128 having their source connected to a drain of the MOS transistors 129 to 132, respectively, and their gate connected through an inverter to the gate of the corresponding MOS transistors 129 to 132, so as to operate in a condition complementary to that of the MOS transistors 129 to 132, and a voltage supply 108 connected to a drain of the MOS transistors 125 to 128, respectively. Respective connection nodes between the MOS transistors 125 to 128 and the MOS transistors 129 to 132 are connected to word lines 133 to 136 of the cell array 105, respectively.

The cell array 105 includes the sense lines 121 to 124, the word lines 133 to 136 and magneto-resistive elements 137 to 152 located at intersections between the sense lines 121 to 124 and the word lines 133 to 136, respectively, each of the magneto-resistive elements 137 to 152 being connected between one sense line and one word line. The magneto-resistive elements 137 to 152 is formed of a tunnel type magneto-resistive element or a giant magneto-resistive effect element.

When the MRAM circuit is in a standby condition, the MOS transistors 109 to 112 are maintained in an ON condition, so that the capacitors 113 to 116 are charged to a predetermined initial voltage $V_{D0}$. Similarly, the input side of the MOS transistors 117 to 120 connected to the capacitors 113 to 116 is at the predetermined initial voltage $V_{D0}$. At this time, accordingly, the voltage $V_{D0}$ is outputted through the output lines 153 to 156, respectively. The MOS transistors 117 to 120 are provided to hold the sense lines 121 to 124 at a constant low voltage. A voltage (Vs) at the output side of the MOS transistors 117 to 120 is determined by a reference voltage ($V_{ref}$) generated in the reference voltage circuit 107 and a constant drop voltage (Vdrp) determined by a threshold characteristics of the MOS transistors 117 to 120, and therefore, even if the voltage ($V_D$) of the input side of the MOS transistors 117 to 120 varies, the output side voltage ($V_S$) of the MOS transistors 117 to 120 does not vary. Here, the following relation established among Vs, Vref and Vdrp:

$$V_S = V_{ref} - V_{drp} \text{ (where } V_D > V_S\text{)} \quad (1)$$

Accordingly, the voltage of all the sense lines 121 to 124 are at an equal potential ($V_S$).

On the other hand, the MOS transistors 125 to 128 and the MOS transistors 129 to 132 operate complementarily to each other, in response to a signal supplied from the X decoder 103. When the MRAM circuit is in the standby condition, the MOS transistors 125 to 128 are in an ON condition and the MOS transistors 129 to 132 are in an OFF condition. At this time, the voltage supply 108 is connected to the word lines 133 to 136 through the MOS transistors 125 to 128, so that all the word lines 133 to 136 are maintained to be at an equal potential ($V_S$), similarly to the sense lines 121 to 124.

Figure 4:
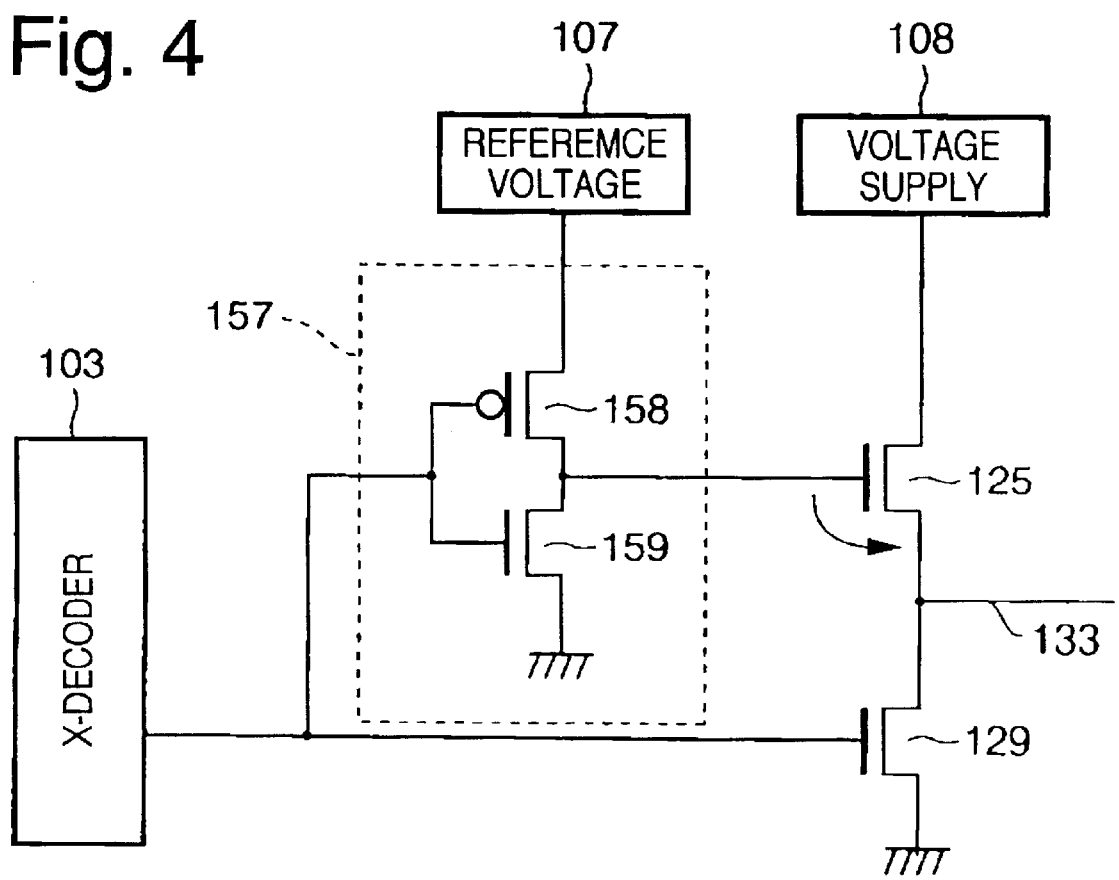
FIG. 4 is a circuit diagram showing a details of the inverter shown in FIG. 3.

In order to maintain the word lines 133 to 136 at a potential $V_S$ equal to that of the sense lines 121 to 124, several methods can be considered. Specifically, for example, if $V_S$ is given from the voltage supply 108 in FIG. 3, it is possible to maintain the word lines 133 to 136 at the potential $V_S$. In another method, the inventer 157 connected to the gate of the MOS transistor 125 is constituted of a PMOS transistor 158 and a source-grounded NMOS transistor 159 having a drain connected to a drain of the PMOS transistor 158, as shown in FIG. 4. In this case, a source of the PMOS transistor 158 is connected to the reference voltage circuit 107, and a connection node between the PMOS transistor 158 and the NMOS transistor 159 is connected to the gate of the MOS transistor 125. Thus, because of a threshold characteristics of the MOS transistor 125, it is possible to maintain the word line 133 at the potential $V_S$, similarly to the sense lines 121 to 124. These two examples are a mere example for maintaining the word lines 133 to 136 at the potential $V_S$, and therefore, the present invention is in no way limited to these examples.

Now, explanation will be described on a case that data held in for example the magneto-resistive element 142 is read out. The magneto-resistive element 142 is positioned at a second row and a second column in the cell array 105. First, the MOS transistor 130 is turned on in response to a signal from the X decoder 103, and at the same time, the MOS transistor 126 is turned off. Accordingly, the word line 134 of the second row is grounded through the MOS transistor 130 Thus, an electric current flows from the voltage supply 106 through the MOS transistors 110, the MOS transistor 118, the sense line 122, the magneto-resistive element 142, the word line 134 and the MOS transistor 130. At this time, a current also flows through the magneto-resistive elements 141, 143 and 144 connected to the same word line 134. This current will be described hereinafter.

Here, an important point is that (1) all the sense lines 121 to 124 are maintained at the equal potential ($V_S$) by action of the MOS transistors 117 to 120, and (2) the not-selected word lines 133, 135 and 136 are maintained at the equal potential ($V_S$) by action of the MOS transistors 125, 127 and 128. Therefore, without using either the MOS transistor or the diode in each cell, it is possible to prevent a current from being flowed from an not-intended path, so that the current of the magnitude determined by the voltage $V_S$ and the resistance value of the respective magneto-resistive elements 141 to 144 flow through the sense lines 121 to 124.

Succeeding to the selection of the word line 134 of the second row, the sense line 122 of the second column is selected by a signal from the Y decoder 101. At this time, the MOS transistor 110 is turned off so that the sense line 122 of the second column is isolated from the voltage supply 106, but the electric charges charged in the capacitor 114 is discharged, so that the current continues to flow through the magneto-resistive element 142. As a result, the voltage of the capacitor 114, namely, the input side voltage of the MOS transistor 118 lowers. However, since the output side voltage ($V_S$) of the MOS transistor 118 is determined by the above mentioned equation (1), the output side voltage ($V_S$) of the MOS transistor 118 does not change and therefore is maintained at a constant level.

At this time, a change in time $V_D(t)$ of the voltage on the capacitor 114 after a time "t" can be expressed by the following equation (2):

$$V_D(t) = V_{D0} - \frac{1}{C}\int I_S \, dt = V_{D0} - \frac{V_S}{CR} t \qquad (2)$$

where $V_{D0}$: initial voltage;

C: capacitance of the capacitor 114;

Is: current flowing through the sense line 122;

$V_S$: the output side voltage of the MOS transistor 118;

R: composite resistance of the sense line 122 (becoming a load resistance of the MOS transistor 118), the magneto-resistive element 142, the word line 134 and the MOS transistor 130

As seen from the equation (2), the rate of the change in time $V_D(t)$ of the voltage on the capacitor 114 varies dependently upon the resistance of the magneto-resistive element 142. Namely, when the magneto-resistive element 142 is in a high resistance condition, the change in time of the voltage on the capacitor 114 is small. On the other hand, when the magneto-resistive element 142 is in a low resistance condition, the change in time of the voltage on the capacitor 114 is large. Thus, by detecting the change in time of the voltage on the capacitor 114 or the voltage itself on the capacitor 114 through the output line 154 after a given constant time has been elapsed, it is possible to detect the resistance condition of the magneto-resistive element 142, namely, the data held in the magneto-resistive element 142.

In the MRAM circuit in accordance with the present invention, since the voltage applied to the magneto-resistive element 142 is $V_S$, the voltage applied to the magneto-resistive element 142 can be maintained to be smaller than a voltage breaking the magneto-resistive element 142 or a voltage remarkably deteriorating the characteristics of the magneto-resistive element 142 because of the bias dependency. However, by action of the capacitor 114, the voltage appearing on the output line 154 can be enlarged to a degree enough to be sufficiently detected by a succeeding stage of detecting circuit.

In addition, in the MRAM circuit in accordance with the present invention, even if the resistance of the wiring conductor and/or the MOS transistor 130 connected in series with the magneto-resistive element 142 is large, or even if the magneto-resistance ratio of the magneto-resistive element 142 is not sufficiently large, a sufficient reading voltage can be obtained by optimizing the capacitance C of the capacitors 113 to 116, the voltage $V_S$ applied to the magneto-resistive elements, an electric resistance value of the magneto-resistive elements 137 to 152, and the time "t" required for discharging the capacitor, included in the equation (2).

In the MRAM circuit in accordance with the present invention, since the structure of the memory cell is very simple, it is easy to elevate the integration density. The reading speed is determined by the capacitance C of the capacitors 113 to 116, the electric resistance value of the magneto-resistive elements 137 to 152, and the voltage $V_S$ applied to the magneto-resistive elements 137 to 152. Therefore, by optimizing these parameters, it is possible to realize the reading at a very high speed. On the other hand, the capacitors 113 to 116 are charged in the standby condition, and therefore, the charging of the capacitors 113 to 116 does not influence the reading speed.

Furthermore, as mentioned hereinbefore, in the circuit of this embodiment, the electric current also flows through the magneto-resistive elements 141, 143 and 144 connected to the word line 134 connected to the selected memory cell. Accordingly, by turning off the MOS transistors 109, 111 and 112 similarly to the MOS transistor 110, it is possible to read out information recorded in the magneto-resistive elements 141, 143 and 144, through the output lines 153, 155 and 156, in parallel, at the same time as the information recorded in the magneto-resistive element 142 is read out.

Moreover, an electric power consumed for the reading is basically the amount for charging and discharging the capacitors, and therefore, is very small. In particular, if the parallel reading is carried out as mentioned above, the efficiency of the power consumption to the read-out data amount becomes further high.

In addition, in the above mentioned sequence for the data reading, the MOS transistor 130 is first turned on, and simultaneously, the MOS transistor 126 is turned off, and thereafter, the MOS transistor 110 is turned off. However, this on-off switching sequence of the MOS transistors can be inverted, or alternatively, the on-off switching of the MOS transistors can be executed at the same time.

Figure 5:
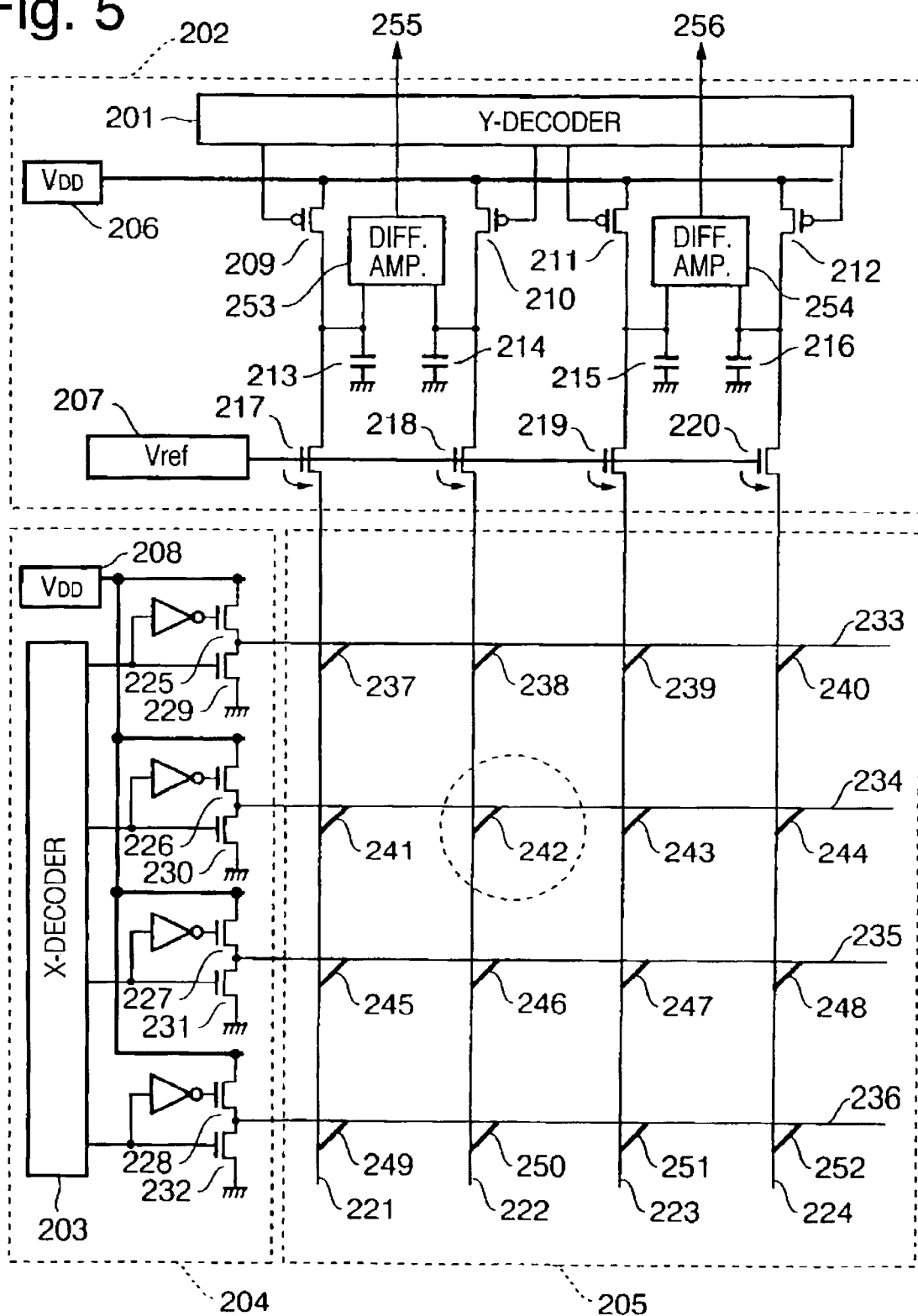
FIG. 5 is a circuit diagram of a second embodiment of the MRAM circuit in accordance with the present invention.

Referring to FIG. 5, there is shown a circuit diagram of a second embodiment of the MRAM circuit in accordance with the present invention. In FIG. 5, elements similar to those shown in FIG. 3 are given the Reference Number obtained by adding "100" to the Reference Number given to the corresponding element shown in FIG. 3, and explanation will be omitted as a general rule.

The MRAM circuit shown in FIG. 5 basically operates similarly to the MRAM circuit shown in FIG. 3, but is characterized in that two magneto-resistive elements connected to the same word line and also connected to a pair of adjacent sense lines, respectively, are paired so that a pair of complementary data is written into the pair of magneto-resistive elements. Namely, respective directions of the magnetization in the pair of magneto-resistive elements are so set that, when one of the pair of magneto-resistive elements is in a high resistance condition, the other of the pair of magneto-resistive elements is in a low resistance condition without exception. In this connection, when the stored data is "1", it is possible to arbitrarily determine which of the pair of magneto-resistive elements is to be in the high resistance condition, on a circuit basis. Each of the pair of magneto-resistive elements is connected through the sense line and the MOS transistor to the capacitor, and respective voltages of the two capacitors are compared to each other by use of a differential amplifier (253 or 254), so that an output of this differential amplifier is outputted as a data output. In this embodiment, since information of one bit is stored by using a pair of magneto-resistive elements, the MRAM circuit shown in FIG. 5 shows an example of the circuit configured to store "4×2" bits.

Now, explanation will be made on a case that data stored in for example a pair of magneto-resistive elements 241 and 242 is read out.

The magneto-resistive element 241 is positioned at a second row and at a first column in the cell array, and the magneto-resistive element 242 is positioned at the second row and at a second column in the cell array. First, in response to a signal supplied from the X decoder 203, the MOS transistor 230 is turned on, and simultaneously, the MOS transistor 226 is turned off, so that the word line 234 of the second row is grounded through the MOS transistor 230, and an electric current flows from the voltage supply 206 through the MOS transistor 209, the MOS transistor 217, the sense line 221, the magneto-resistive element 241, the word line 234 and the MOS transistor 230. At the same time, an electric current flows from the voltage supply 206 through the MOS transistor 210, the MOS transistor 218, the sense line 222, the magneto-resistive element 242, the word line 234 and the MOS transistor 230.

All the sense lines 221 to 224 are maintained at the equal potential ($V_S$) by action of the MOS transistors 217 to 220, and the not-selected word lines 233, 235 and 236 are also maintained at the equal potential ($V_S$) by action of the MOS transistors 225, 227 and 228. Therefore, without using either the MOS transistor or the diode in each cell, it is possible to prevent a current from being flowed from an not-intended path, so that the current of the magnitude determined by the voltage $V_S$ and the resistance value of the respective magneto-resistive elements 241 to 244 flow through the sense lines 221 to 224.

Succeeding to the selection of the word line 234 of the second row, the sense line 221 of the first column and the sense line 222 of the second column are selected by signals from the Y decoder 201. At this time, the MOS transistors 209 and 210 are turned off so that the sense line 221 of the first column and the sense line 222 of the second column are isolated from the voltage supply 206, but the electric charges charged in the capacitors 213 and 214 are discharged, so that the current continues to flow through the magneto-resistive elements 241 and 242. As a result, the voltage of the capacitors 213 and 214, namely, the input side voltage of the MOS transistors 217 and 218 lowers. However, since the output side voltage ($V_S$) of the MOS transistors 217 and 218 is determined by the above mentioned equation (1), the output side voltage ($V_S$) of the MOS transistors 217 and 218 does not change and therefore is maintained at a constant level.

At this time, a change in time $V_D(t)$ of the voltage on the capacitors 213 and 214 after a time "t" can be expressed by the above mentioned equation (2).

As seen from the equation (2), the rate of the change in time $V_D(t)$ of the voltage on the capacitors 213 and 214 varies dependently upon the resistance of the magneto-resistive elements 241 and 242. For example, assume that when the stored data is "1", the magneto-resistive element 241 is in the high resistance condition, and the magneto-resistive element 242 is in he low resistance condition. At this time, the rate of the change in time $V_D(t)$ of the voltage drop of the capacitor 214 is larger than the rate of the change in time $V_D(t)$ of the voltage drop of the capacitor 213. To the contrary, when the stored data is "0", the magneto-resistive element 241 is in the low resistance condition, and the magneto-resistive element 242 is in the high resistance condition. At this time, the rate of the change in time $V_D(t)$ of the voltage drop of the capacitor 214 is smaller than the rate of the change in time $V_D(t)$ of the voltage drop of the capacitor 213. Thus, after a given constant time has been elapsed, a difference between the voltage of the capacitor 213 and the voltage of the capacitor 214 is detected by action of the differential amplifier 253, and the result of the detection is outputted as a read-out data through the output line 255.

Here, the difference Vout(t) between the voltage of the capacitor 213 and the voltage of the capacitor 214 after the given constant time "t" has been elapsed, can be expressed as follows, on the basis of the equation (2):

$$\text{Vout}(t)=(V_S/C)\{(1/R_L)-(1/R_H)\}t \quad (3)$$

where $R_L$ is a load resistance of the MOS transistor (composite resistance of the sense line, the magneto-resistive element and the MOS transistor 230, which become a load) when the magneto-resistive element in the low resistance condition; and $R_H$ is a load resistance of the MOS transistor (composite resistance of the sense line, the magneto-resistive element and the MOS transistor 230, which become a load) when the magneto-resistive element in the high resistance condition.

For example, assume that the capacitance C of the capacitor is 1 pF, the output side voltage $V_S$ of the MOS transistor is 250 mV, the resistance $R_L$ of the magneto-resistive element in the low resistance condition is 10 kΩ, the resistance $R_R$ of the magneto-resistive element in the low resistance condition is 12 kΩ, which are easily feasible. Furthermore, assume that a discharge time (the given constant time "t" mentioned above) of the capacitors 213 and 214 is 24 nsec. It would be seen from the equation (3) that Vout(24 nsec) of ±100 mV can be obtained dependently upon whether the stored data is "1" or "0". Since an input voltage (detectable voltage) of the sense amplifier (differential amplifier) in existing semiconductor DRAMs is on the order of 100 mV, this value of ±100 mV can be easily detected.

In the MRAM circuit of this embodiment, since the voltage applied to the magneto-resistive elements 241 and 242 is $V_S$, the voltage applied to the magneto-resistive elements can be maintained to be smaller than a voltage breaking the magneto-resistive elements 241 and 242 or a voltage remarkably deteriorating the characteristics of the magneto-resistive elements 241 and 242. However, by action of the capacitors 231 and 214, the voltage difference applied to the differential amplifier (detector) 253 can be enlarged to a degree enough to be sufficiently detected by a conventional detecting circuit (differential amplifier).

The reading speed is mainly determined by the capacitance C of the capacitors, the electric resistance value of the magneto-resistive elements, and the voltage $V_S$ applied to the magneto-resistive elements. Therefore, by optimizing these parameters, it is possible to realize the reading at a very high speed. On the other hand, since the capacitors are charged in the standby condition, the charging of the capacitors does not influence the reading speed.

In addition, since the structure of the memory cell is very simple, it is easy to elevate the integration density. Moreover, since the signal from an adjacent magneto-resistive element is utilized as a reference data, stability of a circuit operation against a process variation is excellent.

In addition, in the MRAM circuit of this embodiment, even if the resistance of the wiring conductor and/or the MOS transistor connected in series with the magneto-resistive element is large, or even if the magneto-resistance ratio of the magneto-resistive element is not sufficiently large, a sufficient reading voltage can be obtained by optimizing the capacitance C of the capacitors, the voltage $V_S$ applied to the magneto-resistive elements, an electric resistance value of the magneto-resistive elements, and the time "t" required for discharging the capacitor, included in the equation (2).

Furthermore, as mentioned hereinbefore, in the circuit of this embodiment, the electric current also flows through the magneto-resistive elements 243 and 244 connected to the word line 234 connected to the selected pair of memory cells. Accordingly, by turning off the MOS transistors 211 and 212 similarly to the MOS transistors 209 and 210, it is possible to read out information recorded in the pair of magneto-resistive elements 243 and 244, by action of the differential amplifier (detector) 254, at the same time as the information recorded in the pair of magneto-resistive elements 241 and 242 is read out.

Moreover, an electric power consumed for the reading is basically the amount for charging and discharging the capacitors, and therefore, is very small. In particular, if the parallel reading is carried out as mentioned above, the efficiency of the power consumption to the read-out data amount becomes further high. In addition, the above mentioned sequence for the data reading is merely one example, but another sequence for the data reading can be arbitrarily adopted.

Figure 6:
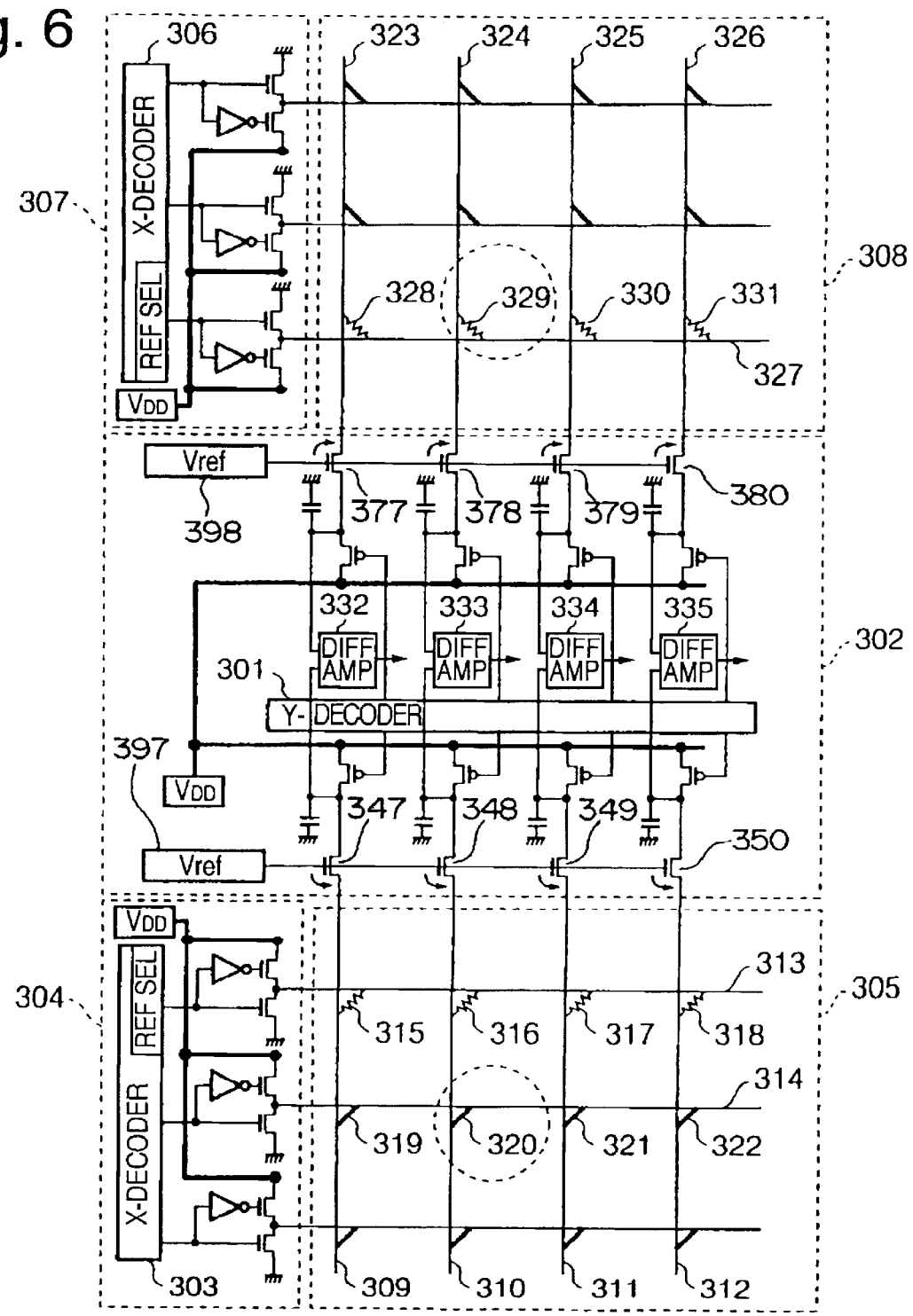
FIG. 6 is a circuit diagram of a third embodiment of the MRAM circuit in accordance with the present invention.

Referring to FIG. 6, there is shown a circuit diagram of a third embodiment of the MRAM circuit in accordance with the present invention. The MRAM circuit shown in FIG. 6 basically operates similarly to the MRAM circuit shown in FIG. 5, but is characterized in that a reference signal to be compared by a differential amplifier is not obtained from the magneto-resistive element storing a complementary data, but is obtained from a reference resistance.

The shown MRAM circuit of this embodiment includes a Y peripheral circuit 302 having a Y decoder 301, a first X peripheral circuit 304 having a first X decoder 303, a first cell array 305, a second X peripheral circuit 307 having a second X decoder 306, a second cell array 308. The second X peripheral circuit 307 and the second cell array 308 are located in symmetry to the first X peripheral circuit 304 and the first cell array 305, with respect to the Y peripheral circuit 302. In each of the cell arrays 305 and 308, reference resistors are connected to at least one word line. In the embodiment shown in FIG. 6, reference resistors 315 to 318 are connected to a word line 313 in the first cell array 305, and reference resistors 328 to 331 are connected to a word line 327 in the second cell array 308. Excepting these reference resistors, each of the first and second cell arrays 305 and 308 is similar to the cell array 105 in the first embodiment shown in FIG. 3.

In this embodiment, for example, when information of the magneto-resistive element 320 connected between a sense line 310 and a word line 314 in the first cell array 305 is read out, a signal from the reference resistor 329 connected between a sense line 324 and a word line 327 in the second cell array 308 is used as a reference signal, and a signal read out from the magneto-resistive element 320 is compared with the reference signal by action of a differential amplifier 333, similarly to the MRAM circuit of the second embodiment. At this time, information stored in the magneto-resistive elements 319, 321 and 322 can be read out by being compared with a signal from the reference resistors 328, 330 and 331 by action of differential amplifiers 332, 334 and 335, respectively.

As seen from the above, when information is read out from any magneto-resistive element in the first cell array 305, the word line 327 is selected by a reference resistor selection circuit "REF SEL" in the second X decoder 306, so that a corresponding one or all of the reference resistors 328 to 331 connected to the word line 327 are utilized to generate the reference signal. On the other hand, when information is read out from any magneto-resistive element in the second cell array 308, the word line 313 is selected by a reference resistor selection circuit "REF SEL" in the first X decoder 303, so that a corresponding one or all of the reference resistors 315 to 318 connected to the word line 313 are utilized to generate the reference signal. Therefore, excepting the reference resistor selection circuit "REF SEL", each of the first and second X peripheral circuits 304 and 307 is similar to the X peripheral circuit 104 shown in FIG. 3.

The Y peripheral circuit 302 is composed of a combination of a Y peripheral circuit portion similar to the Y peripheral circuit 102 shown in FIG. 3, associated to the first cell array 305, and another Y peripheral circuit portion similar to the Y peripheral circuit 102 shown in FIG. 3, associated to the second cell array 308, but only one Y decoder 301 is provided in common to the two Y peripheral circuit portions. In addition, the four differential amplifiers 332 to 335 are provided to compare between a signal from the first cell array 305 and a signal from the second cell array 308.

In the MRAM circuit of this embodiment, since the structure of the memory cell is very simple, it is easy to elevate the integration density. Moreover, since the signal from the reference resistors 315 to 318 and 328 to 331 is utilized as a reference data, the area efficiency of the chip is high so that a high integration density can be obtained. In addition, stability of a circuit operation against a process variation is excellent.

Furthermore, in the MRAM circuit of this embodiment, since the voltage applied to the magneto-resistive elements is $V_S$, the voltage applied to the magneto-resistive elements can be maintained to be smaller than a voltage breaking the magneto-resistive elements or a voltage remarkably deteriorating the characteristics of the magneto-resistive elements. However, by action of the capacitors, the voltage difference applied to the differential amplifier (detector) can be enlarged to a degree enough to be sufficiently detected by a conventional detecting circuit (differential amplifier).

The reading speed is mainly determined by the capacitance C of the capacitors, the electric resistance value of the magneto-resistive elements, and the voltage $V_S$ applied to the magneto-resistive elements. Therefore, by optimizing these parameters, it is possible to realize the reading at a very high speed. On the other hand, since the capacitors are charged in the standby condition, the charging of the capacitors does not influence the reading speed.

In addition, in the MRAM circuit of this embodiment, even if the resistance of the wiring conductor and/or the MOS transistor connected in series with the magneto-resistive element is large, or even if the magneto-resistance ratio of the magneto-resistive element is not sufficiently large, a sufficient reading voltage can be obtained by optimizing the capacitance C of the capacitors, the voltage $V_S$ applied to the magneto-resistive elements, an electric resistance value of the magneto-resistive elements, and the time "t" required for discharging the capacitor, included in the equation (2).

Moreover, an electric power consumed for the reading is basically the amount for charging and discharging the capacitors, and therefore, is very small. In particular, if the parallel reading is carried out as mentioned above, the efficiency of the power consumption to the read-out data amount becomes further high. In addition, the above mentioned sequence for the data reading is merely one example, but another sequence for the data reading can be arbitrarily adopted.

Figure 7:
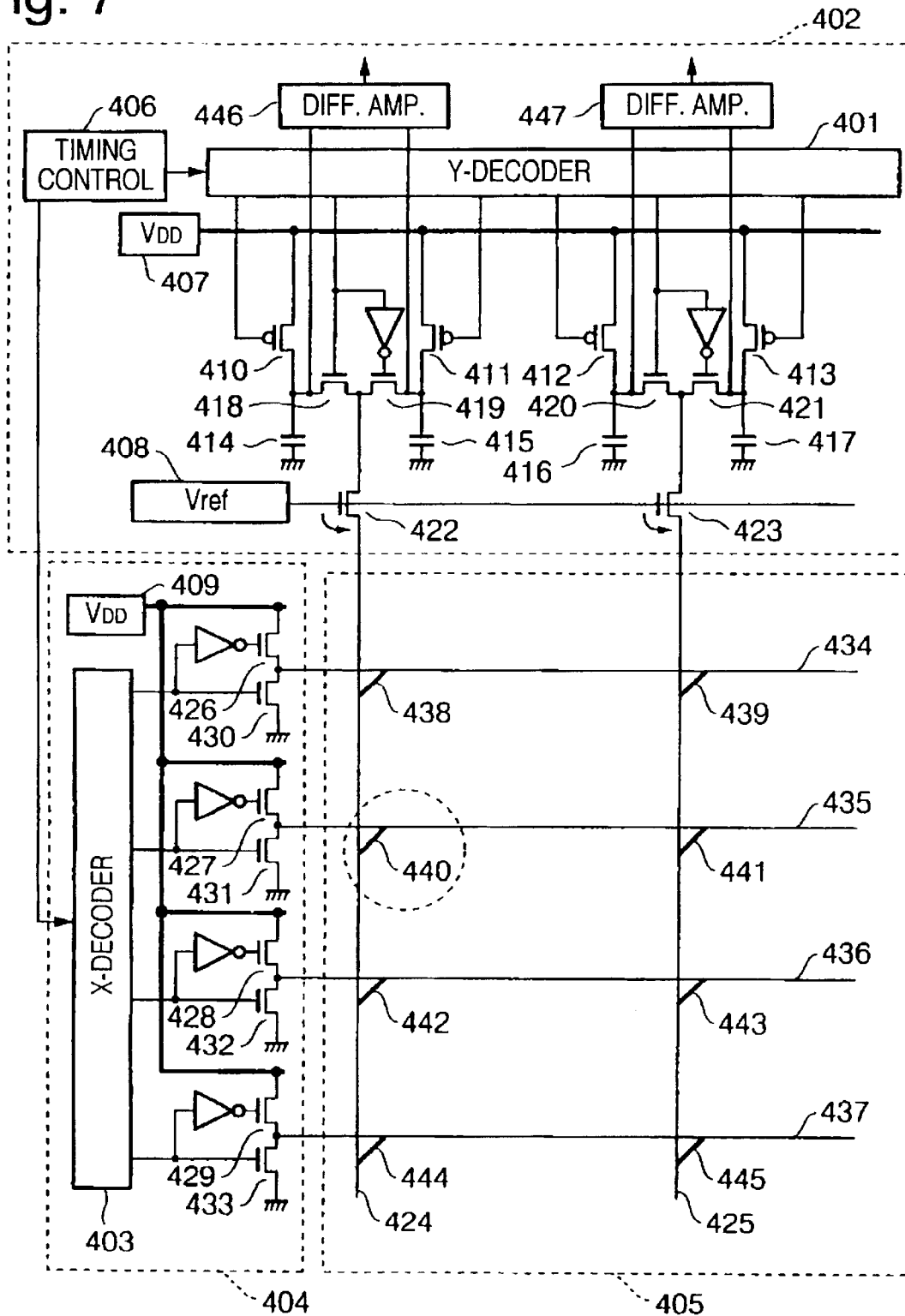
FIG. 7 is a circuit diagram of a fourth embodiment of the MRAM circuit in accordance with the present invention.

Referring to FIG. 7, there is shown a circuit diagram of a fourth embodiment of the MRAM circuit in accordance with the present invention. The MRAM circuit shown in FIG. 7 basically operates similarly to the MRAM circuit shown in FIG. 5, but is characterized in adopting a self-reference type reading method in that a signal generated by changing the state of a magneto-resistive element to be read out, is used as a reference signal for a differential amplifier.

The shown MRAM circuit of this embodiment includes a Y peripheral circuit 402 having a Y decoder 401, an X peripheral circuit 404 having an X decoder 403, and a cell array 405. An operation timing of the Y decoder 401 and the X decoder 403 is controlled by a timing controller 406. Since the X peripheral circuit 404 and the cell array 405 are similar to the X peripheral circuit 104 and the cell array 105 shown in FIG. 3, explanation thereof will be omitted.

On the other hand, the Y peripheral circuit 402 includes, in addition to the Y decoder 40, fifth MOS transistors 410 and 412 and sixth MOS transistors 411 and 413 having their gate connected to the Y decoder 401, a voltage supply 407 connected to a source of the fifth MOS transistors 410 and 412 and the sixth MOS transistors 411 and 413, seventh MOS transistors 418 and 420 having their gate connected to the Y decoder 401 and eighth MOS transistors 419 and 421 having their gate connected to the Y decoder 401 through an inverter, the seventh and eighth MOS transistors 418 and 419 being connected in series between a drain of the fifth MOS transistor 410 and a drain of the sixth MOS transistor 411, the seventh and eighth MOS transistors 420 and 421 being connected in series between a drain of the fifth MOS transistor 412 and a drain of the sixth MOS transistor 413, ninth MOS transistors 422 and 423 having their gate connected to a reference voltage circuit 408 and their source connected to sense lines 424 and 425 of the cell array 405, respectively, a drain of the ninth MOS transistors 422 being connected to a connection node between the seventh and eighth MOS transistors 418 and 419, a drain of the ninth MOS transistors 423 being connected to a connection node between the seventh and eighth MOS transistors 420 and 421, capacitors 414 to 417 having one end connected to ground and the other end connected to the drain of the fifth MOS transistors 410 and 412 and the sixth MOS transistors 411 and 413, respectively, and differential amplifiers 446 and 447. The differential amplifier 446 has a pair of inputs connected to the other end of the capacitors 414 and 415, respectively, and the differential amplifier 447 has a pair of inputs connected to the other end of the capacitors 416 and 417, respectively.

When the MRAM circuit is in a standby condition, the MOS transistors 410 to 413 are maintained in an ON condition, so that the capacitors 414 to 417 are charged to a predetermined initial voltage $V_{D0}$. At this time, the MOS transistors 418 and 420 are maintained in an ON condition, and the MOS transistors 419 and 421 are maintained in an OFF condition. Accordingly, the input side of the ninth MOS transistors 422 and 423 connected to the capacitors 414 and 416 through the MOS transistors 418 and 420, respectively, is at the predetermined initial voltage. The ninth MOS transistors 422 and 423 are provided to hold the sense lines 424 and 425 at a constant low voltage.

A voltage ($V_S$) at the output side of the ninth MOS transistors 422 and 423 is determined by a reference voltage ($V_{ref}$) generated in the reference voltage circuit 408 and a constant drop voltage (Vdrp) determined by a threshold characteristics of the ninth MOS transistors 422 and 423, and therefore, even if the voltage ($V_D$) of the input side of the ninth MOS transistors 422 and 423 varies, the output side voltage ($V_S$) of the ninth MOS transistors 422 and 423 does not vary, and is determined by the equation (1). Accordingly, all the sense lines 424 and 425 are at an equal potential ($V_S$). Similarly, in the standby condition, all the word lines 434 to 437 are maintained at an equal potential ($V_S$) by action of the tenth transistors 426 to 429 in the X peripheral circuit 404.

Now, explanation will be described on a case that data held in for example the magneto-resistive element 440 is read out. In response to a signal from the X decoder 403, the tenth MOS transistor 431 is turned on, and at the same time, the eleventh MOS transistor 427 is turned off. Accordingly, an electric current flows from the voltage supply 407 through the MOS transistors 410, the MOS transistor 418, the MOS transistor 422, the sense line 424, the magneto-resistive element 440, the word line 435 and the MOS transistor 431. At this time, all the sense lines 424 and 425 are maintained at the equal potential ($V_S$) by action of the MOS transistors 422 and 423, and the not-selected word lines 434, 436 and 437 are maintained at the equal potential ($V_S$) by action of the MOS transistors 426, 428 and 429. Therefore, without using either the MOS transistor or the diode in each cell, it is possible to prevent a current from being flowed from an not-intended path, so that the current of the magnitude determined by the voltage $V_S$ and the resistance value of the respective magneto-resistive elements 440 and 441 flow through the sense lines 424 and 425.

Succeedingly, in response to a signal from the Y decoder 401, the MOS transistor 410 is turned off so that the electric charges charged in the capacitor 414 is discharged to cause the current to continue to flow through the magneto-resistive element 440. As a result, the voltage of the capacitor 414 drops in accordance with the equation (2).

After a given constant time has elapsed, the eleventh MOS transistor 431 is temporarily turned off and simultaneously the tenth MOS transistor 427 is turned on, so that the current flowing through the magneto-resistive element 440 is stopped. Thereafter, a writing circuit is operated to write "1" or "0" into the magneto-resistive element 440 as a reference data, or alternatively to temporarily maintain the magneto-resistive element in an intermediate condition. On the other hand, the MOS transistor 418 is turned off and the MOS transistor 427 is turned on. Furthermore, the MOS transistor 431 is turned on, again, and simultaneously the tenth MOS transistor 427 is turned off, so that an electric current flows from the voltage supply 407 through the MOS transistors 411, the MOS transistor 419, the MOS transistor 422, the sense line 424, the magneto-resistive element 440, the word line 435 and the MOS transistor 431. Then, if the MOS transistor 411 is turned off, so that the electric charges charged in the capacitor 415 is discharged to cause the current to continue to flow through the magneto-resistive element 440. As a result, the voltage of the capacitor 415 drops in accordance with the reference condition of the magneto-resistive element 440.

Again, after a given constant time has elapsed, the eleventh MOS transistor 431 is turned off and simultaneously the tenth MOS transistor 427 is turned on, so that the current flowing through the magneto-resistive element 440 is stopped. Thus, a different between the voltage on the capacitor 414 and the voltage on the capacitor 414 is detected by use of the differential amplifier 446. Finally, by writing an original data into the magneto-resistive element 440 or by returning the temporary intermediate condition to a steady condition, a non-destructive data reading can be realized in the whole of the MRAM circuit.

In the MRAM circuit of this embodiment, since the structure of the memory cell is very simple, it is easy to elevate the integration density. In addition, since data can be detected by the self-reference type, the area efficiency of the chip is high so that a high integration density can be obtained. In addition, stability of a circuit operation against a process variation is excellent.

Furthermore, in the MRAM circuit of this embodiment, since the voltage applied to the magneto-resistive elements is $V_S$, the voltage applied to the magneto-resistive elements can be maintained to be smaller than a voltage breaking the magneto-resistive elements or a voltage remarkably deteriorating the characteristics of the magneto-resistive elements. However, by action of the capacitors, the voltage difference applied to the differential amplifier (detector) can be enlarged to a degree enough to be sufficiently detected by a conventional detecting circuit (differential amplifier).

The reading speed is mainly determined by the capacitance C of the capacitors, the electric resistance value of the magneto-resistive elements, and the voltage $V_S$ applied to the magneto-resistive elements. Therefore, by optimizing these parameters, it is possible to realize the reading at a very high speed. On the other hand, since the capacitors are charged in the standby condition, the charging of the capacitors does not influence the reading speed.

In addition, in the MRAM circuit of this embodiment, even if the resistance of the wiring conductor and/or the MOS transistor connected in series with the magneto-resistive element is large, or even if the magneto-resistance ratio of the magneto-resistive element is not sufficiently large, a sufficient reading voltage can be obtained by optimizing the capacitance C of the capacitors, the voltage $V_S$ applied to the magneto-resistive elements, an electric resistance value of the magneto-resistive elements, and the time "t" required for discharging the capacitor, included in the equation (2).

In addition, since a current similarly flows through the magneto-resistive element 441 connected to the same word line 435, data can simultaneously be read out from the magneto-resistive element 441 in parallel to the magneto-resistive element 440.

Moreover, an electric power consumed for the reading is basically the amount for charging and discharging the capacitors, and therefore, is very small. In particular, if the parallel reading is carried out as mentioned above, the efficiency of the power consumption to the read-out data amount becomes further high. In addition, the above mentioned sequence for the data reading is merely one example, but another sequence for the data reading can be arbitrarily adopted.

Figure 8:
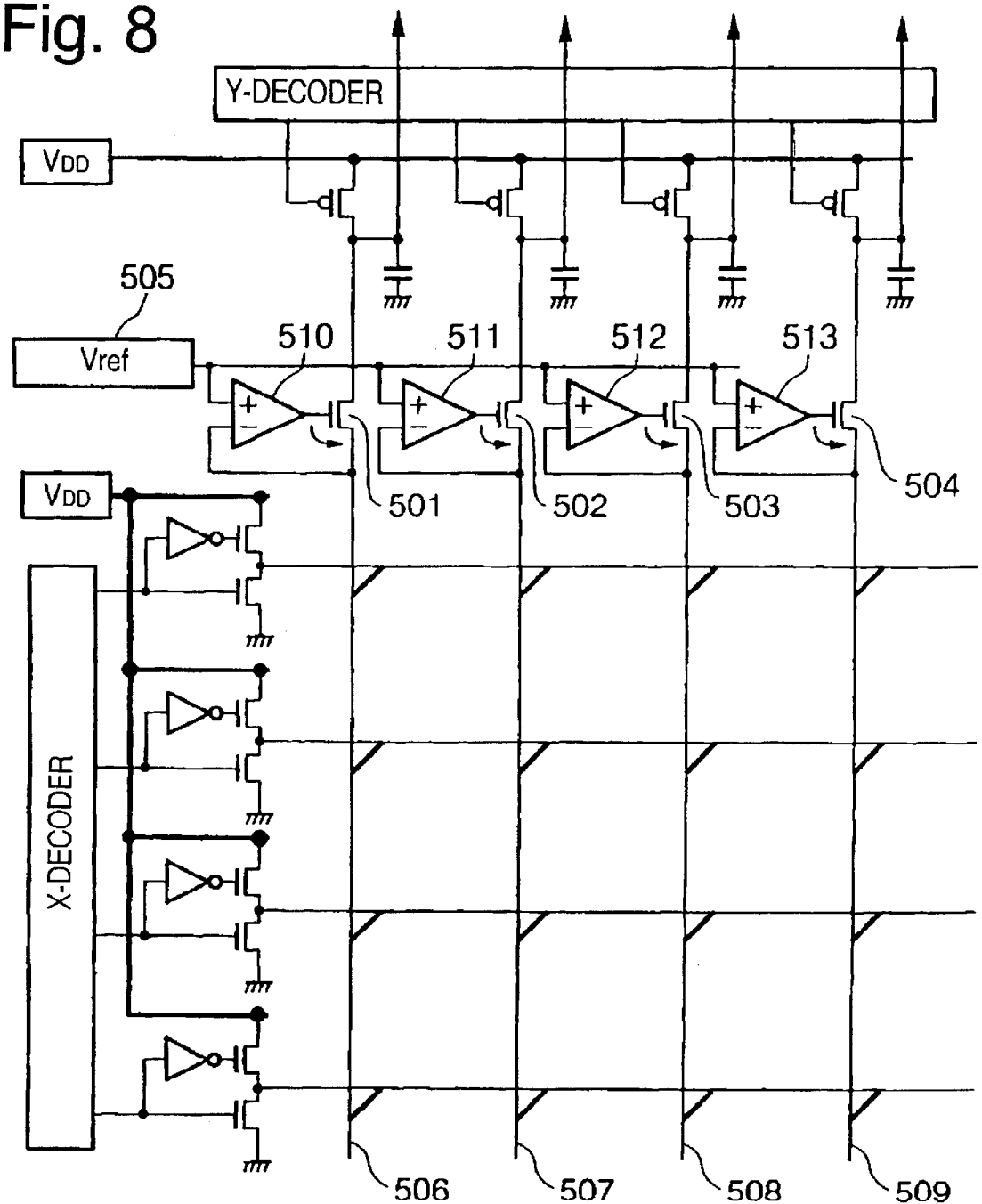
FIG. 8 is a circuit diagram of a fifth embodiment of the MRAM circuit in accordance with the present invention.

Referring to FIG. 8, there is shown a circuit diagram of a fifth embodiment of the MRAM circuit in accordance with the present invention. The MRAM circuit shown in FIG. 8 basically operates similarly to the MRAM circuit shown in FIG. 3, and therefore, in FIG. 8, no Reference Number is given to elements similar to those shown in FIG. 3. The MRAM circuit shown in FIG. 8 is characterized in that comparators 510 to 513 are provided to precisely control the potential of sense lines 506 to 509, and an output of the comparators 510 to 513 is connected to a gate of MOS transistors 501 to 505, respectively, which correspond to the MOS transistors 117 to 120 shown in FIG. 3.

A non-inverting input of each of the comparators 510 to 513 is connected to a reference voltage circuit 505, and an inverting input of the comparators 510 to 513 are connected to the corresponding sense lines 506 to 509, respectively (negative feedback). With this arrangement, if the potential of any sense line is lower than a reference voltage given by the reference voltage circuit 505, a corresponding comparator elevates a gate voltage of the MOS transistor connected to the sense line whose voltage is lower than the reference voltage, with the result that the potential of the sense line is elevated to become equal to the reference voltage. To the contrary, if the potential of any sense line is higher than the reference voltage given by the reference voltage circuit 505, a corresponding comparator lowers a gate voltage of the MOS transistor connected to the sense line whose voltage is higher than the reference voltage, with the result that the potential of the sense line is lowered to become equal to the reference voltage. In any case, the potential of all the sense lines can be precisely maintained at a constant level.

This MRAM circuit of this embodiment stably operates against a process variation. In addition, since the variation of the voltage of the sense lines 506 to 509 caused by a mutual conductance of the MOS transistors 501 to 504 can be minimized, a stable operation can be obtained with a very wide operation margin.

In this embodiment, the comparators 510 to 513 for realizing the feedback control in the operation of the MRAM circuit are provided. However, a similar advantage can be obtained by using a comparator having a pre-calibration function for equalizing the potential of the sense lines and the word lines before a reading operation is carried out in the memory circuit. In this case, it is effective if a comparator is used which can nonvolatilizably hold a calibrated circuit parameter by using for a example a magneto-resistive element.

In the embodiment shown in FIG. 8, in order to precisely control the potential of the sense lines 506 to 509, the comparators 510 to 513 are connected to the reference voltage circuit 505 and the MOS transistors 501 to 504. It would be apparent to persons skilled in the art that a comparator having a similar construction can be connected between the reference voltage circuit 207 and the MOS transistors 217 to 220 shown in FIG. 5, or between the reference voltage circuit 397 and the MOS transistors 347 to 350 and between the reference voltage circuit 398 and the MOS transistors 377 to 380 shown in FIG. 6, or alternatively between the reference voltage circuit 408 and the MOS transistors 422 and 423 shown in FIG. 7, so that the potential of all the sense lines can be maintained at a constant.

As seen from the above, in the MRAM circuit in accordance with the present invention, particularly, in the MRAM circuit using the tunnel magneto-resistive element (TMR element), the voltage applied to the magneto-resistive elements can be maintained to be smaller than a voltage breaking the magneto-resistive elements or a voltage remarkably deteriorating the characteristics of the magneto-resistive elements because of a biasing effect. On the other hand, by action of the capacitors, the voltage difference applied to the differential amplifier (detector) can be enlarged to a degree enough to be sufficiently detected by a conventional detecting circuit (differential amplifier).

In the MRAM circuit in accordance with the present invention, the reading speed is mainly determined by the capacitance C of the capacitors, the electric resistance value of the magneto-resistive elements, and the voltage $V_S$ applied to the magneto-resistive elements. Therefore, by optimizing these parameters, it is possible to realize the reading at a very high speed. On the other hand, since the capacitors are charged in the standby condition, the charging of the capacitors does not influence the reading speed. Furthermore, data can be read out from the magneto-resistive elements connected to the same word lines, simultaneously and in parallel, so that a further high speed reading can be realized.

In addition, in the MRAM circuit in accordance with the present invention, even if the resistance of the wiring conductor and/or the MOS transistor connected in series with the magneto-resistive element is large, or even if the magneto-resistance ratio of the magneto-resistive element is not sufficiently large, a sufficient reading voltage can be obtained by optimizing the capacitance C of the capacitors, the voltage $V_S$ applied to the magneto-resistive elements, an electric resistance value of the magneto-resistive elements, and the time "t" required for discharging the capacitor, included in the equation (2).

Furthermore, if a suitable reference cell is provided, the MRAM circuit having a high chip area efficiency, a high integration density and an excellent stability in a circuit operation against a process variation can be obtained.

Moreover, in the MRAM circuit in accordance with the present invention, it is possible to eliminate the MOS transistor or the diode in each unitary memory cell, by equalizing the potential of the sense lines and the word lines, with the result that the structure of the memory cell becomes very simple, and it becomes easy to elevate the integration density.

In the MRAM circuit in accordance with the present invention, in addition, the electric power consumed for the reading is basically the amount for charging and discharging the capacitors, and therefore, is very small. In particular, if the parallel reading is carried out as mentioned above, the efficiency of the power consumption to the read-out data amount becomes further high.

The invention has thus been shown and described with reference to the specific embodiments. However, it should be noted that the present invention is in no way limited to the details of the illustrated structures but changes and modifications may be made within the scope of the appended claims.

What is claimed is:

1. A magnetic random access memory circuit comprising:
   a memory cell array having a plurality of sense lines, a plurality of word lines intersecting said plurality of sense lines, a number of magneto-resistive elements located at intersections between said plurality of sense lines and said plurality of word lines, each of said magneto-resistive elements being connected between one sense line and one word line;
   a plurality of capacitors of the number corresponding to the number of said plurality of sense lines, said plurality of capacitors being previously charged to a high voltage before a reading operation is carried out, each of said plurality of capacitors being connected to a corresponding sense line of said plurality of sense lines through a voltage drop means so that a voltage lower than said high voltage charged in said capacitors is applied to said plurality of sense lines; and
   means for equalizing the potential of all said plurality of sense lines and all not-selected word lines of said plurality of word lines and for grounding a selected word line of said plurality of word lines so that an electric charge previously stored in said capacitor connected through said voltage drop means to a selected sense line is discharged through said voltage drop means, said selected sense line, a selected magneto-resistive element, and said selected word line, whereby information stored in said selected magneto-resistive element is read out by a potential on said capacitor.

2. A magnetic random access memory circuit comprising:
   a memory cell array having a plurality of sense lines, a plurality of word lines intersecting said plurality of sense lines, a number of magneto-resistive elements located at intersections between said plurality of sense lines and said plurality of word lines, each of said magneto-resistive elements being connected between one sense line and one word line;
   an X peripheral circuit connected to said plurality of word lines and including an X decoder receiving an X address portion of a given address;
   a Y peripheral circuit connected to said plurality of sense lines and including a Y decoder receiving an Y address portion of said given address;
   wherein said Y peripheral circuit includes a plurality of pairs of series-connected first and second MOS transistors connected to said plurality of sense lines, respectively, each first MOS transistor having one end connected to a corresponding sense line of said plurality of sense lines, the other end connected to one end of the corresponding second MOS transistor, a gate connected to a reference voltage circuit, each second MOS transistor having the other end connected to a voltage supply and a gate connected to receive a corresponding output of said Y decoder, a connection node between said first MOS transistor and said second MOS transistor being connected to one end of a capacitor having the other end connected to ground,
   wherein said X peripheral circuit includes a plurality of pairs of series-connected third and fourth MOS transistors having their gates connected to receive a corresponding output of said X decoder so as to operate complementarily to each other, said third MOS transistor having one end connected to a voltage supply and the other end connected to one end of said fourth MOS transistor, the other end of said fourth MOS transistor being connected to ground, a connection node of said third and fourth MOS transistors being connected to a corresponding word line of said plurality of word lines.

3. A magnetic random access memory circuit claimed in claim 2 wherein said Y peripheral circuit includes a plurality of differential amplifiers, each of said differential amplifiers having a pair of inputs connected to a pair of said capacitors connected through a pair of said first MOS transistors to a pair of adjacent sense lines, so that one of a pair of magneto-resistive elements connected to the same word line and to said pair of adjacent sense lines constitutes a memory cell, and the other of said pair of magneto-resistive elements constitutes a reference cell which stores data complementary to data stored in said memory cell, whereby a difference between voltages of said pair of capacitors connected to said pair of adjacent sense lines through said pair of first MOS transistors, respectively, generated dependently upon respective resistance value conditions of said memory cell and said reference cell, is detected by said differential amplifier.

4. A magnetic random access memory circuit claimed in claim 2, further including:
   a second X peripheral circuit provided in symmetry to the first mentioned X peripheral circuit with respect to said Y peripheral circuit, said second X peripheral circuit having the same construction as that of the first mentioned X peripheral circuit; and
   a second memory cell array provided in symmetry to the first mentioned memory cell array with respect to said Y peripheral circuit, said second memory cell array having the same construction as that of the first mentioned memory cell array;
   said Y peripheral circuit being in common to the first mentioned memory cell array and said second memory cell array,
   each of the first mentioned memory cell array and said second memory cell array including a plurality of reference resistors connected between at least one word line and said plurality of sense lines, respectively,
   wherein when a magneto-resistive element included in one of the first mentioned memory cell array and said second memory cell array, is selected to be read out, the voltage of said capacitor connected to said selected magneto-resistive element through said first MOS transistor is compared with the voltage of said capacitor connected to one reference resistor through said first MOS transistor in the other of the first mentioned memory cell array and said second memory cell array.

5. A magnetic random access memory circuit claimed in claim 2, further including a plurality of comparators each having one input connected to said reference voltage circuit, the other input connected to the corresponding sense line, and an output connected to said gate of the corresponding first MOS transistor so that the potential on said corresponding sense line is precisely feedback-controlled on the basis of a reference voltage of said reference voltage circuit.

6. A magnetic random access memory circuit claimed in claim 2, wherein each of said magneto-resistive elements is constituted of a tunnel magneto-resistive element.

7. A magnetic random access memory circuit claimed in claim 2, wherein each of said magneto-resistive elements is constituted of a giant magneto-resistive element.

8. A magnetic random access memory circuit comprising:
- a memory cell array having a plurality of sense lines, a plurality of word lines intersecting said plurality of sense lines, a number of magneto-resistive elements located at intersections between said plurality of sense lines and said plurality of word lines, each of said magneto-resistive elements being connected between one sense line and one word line;
- an X peripheral circuit connected to said plurality of word lines and including an X decoder receiving an X address portion of a given address;
- a Y peripheral circuit connected to said plurality of sense lines and including a Y decoder receiving an Y address portion of said given address;
- wherein said Y peripheral circuit includes:
  - a plurality of pairs of parallel-connected first and second MOS transistors having their gates connected to receive corresponding outputs of said Y decoder, respectively, each of said pairs of first and second MOS transistors being provided for a corresponding one of said plurality of sense lines, one end of each of said first and second MOS transistors being connected to a voltage supply, the other end of said first and second MOS transistors being connected to ground through a first capacitor and a second capacitor, respectively;
  - a plurality of pairs of series-connected third and fourth MOS transistors having their gates connected to receive a corresponding output of said Y decoder so as to operate complementarily to each other, each pair of said pairs of series-connected third and fourth MOS transistors being connected between the other end of the corresponding first MOS transistor and the other end of the corresponding second MOS transistor; and
  - a plurality of fifth MOS transistors having their gates connected to a reference voltage circuit, each of said plurality of fifth MOS transistors having one end connected to a connection node between the corresponding seventh and eighth MOS transistors, and the other end connected to a corresponding sense line of said plurality of sense lines,
  - whereby a voltage on the connection node between said first capacitor and the corresponding first MOS transistor and a voltage on the connection node between said second capacitor and the corresponding second MOS transistor are compared for reading out data on a selected magneto-resistive element connected to the corresponding sense line,
  - wherein said X peripheral circuit includes a plurality of pairs of series-connected sixth and seventh MOS transistors having their gate connected to receive a corresponding output of said X decoder so as to operate complementarily to each other, said sixth MOS transistor having one end connected to a voltage supply and the other end connected to one end of said seventh MOS transistor, the other end of said seventh MOS transistor being connected to ground, a connection node of said sixth and eleventh MOS transistors being connected to a corresponding word line of said plurality of word lines,
  - wherein the magnetic random access memory circuit further includes a timing controller for controlling respective operation timings of said X decoder and said Y decoder.

9. A magnetic random access memory circuit claimed in claim 8, further including a plurality of comparators each having one input connected to said reference voltage circuit, the other input connected to the corresponding sense line, and an output connected to said gate of the corresponding fifth MOS transistor so that the potential on said corresponding sense line is precisely feedback-controlled on the basis of a reference voltage of said reference voltage circuit.

10. A magnetic random access memory circuit claimed in claim 8, wherein each of said magneto-resistive elements is constituted of a tunnel magneto-resistive element.

11. A magnetic random access memory circuit claimed in claim 8, wherein each of said magneto-resistive elements is constituted of a giant magneto-resistive element.

\* \* \* \* \*